(12) United States Patent
Smith

(10) Patent No.: US 6,525,806 B1
(45) Date of Patent: Feb. 25, 2003

(54) APPARATUS AND METHOD OF IMAGE ENHANCEMENT THROUGH SPATIAL FILTERING

(75) Inventor: Bruce W. Smith, Webster, NY (US)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 09/606,613

(22) Filed: Jun. 29, 2000

Related U.S. Application Data

(60) Provisional application No. 60/196,621, filed on Apr. 11, 2000, and provisional application No. 60/142,010, filed on Jul. 1, 1999.

(51) Int. Cl.$^7$ ............ G03B 27/72; G03B 27/42; G03B 27/52; G03B 27/32; G03C 5/00
(52) U.S. Cl. ............ 355/71; 355/53; 355/55; 355/67; 355/77; 430/311; 430/312
(58) Field of Search ............ 355/53, 55, 67, 355/71, 77; 430/311, 312

(56) References Cited

U.S. PATENT DOCUMENTS

| | | | |
|---|---|---|---|
| 5,851,701 A | * | 12/1998 | Rolson |
| 5,888,678 A | * | 3/1999 | Tzu et al. |
| 5,922,513 A | * | 7/1999 | Jeon et al. |

* cited by examiner

*Primary Examiner*—Russell Adams
*Assistant Examiner*—Khaled Brown
(74) *Attorney, Agent, or Firm*—Pillsbury Winthrop LLP

(57) ABSTRACT

An image enhancement apparatus and method are disclosed. The apparatus consists of a spatial frequency filter where zero order mask diffraction information is reduced in an alternative pupil plane of the objective lens, specifically just beyond the mask plane. By introducing an angular specific transmission filter into this Fraunhofer diffraction field of the mask, user accessibility is introduced, allowing for a practical approach to frequency filtering. This frequency filtering is accomplished using a specifically designed interference filter coated over a transparent substrate. Alternatively, filtering can also be accomplished in a complimentary region near the wafer image plane or in both near-mask and near-wafer planes.

47 Claims, 16 Drawing Sheets

Conventional σ=0.7   Strong PSM σ=0.2   Attenuated PSM
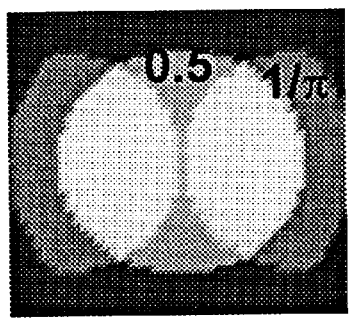 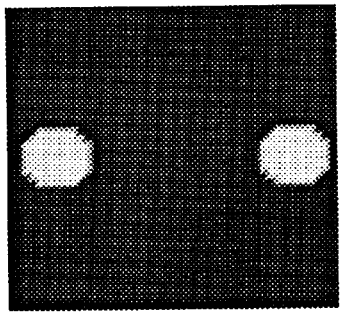 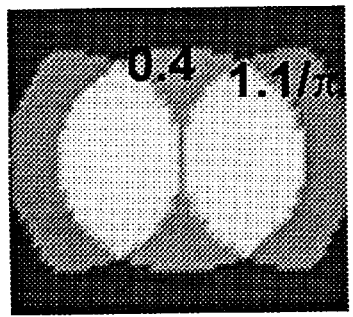
*FIG. 2A*  *FIG. 2B*  *FIG. 2C*
*PRIOR ART*  *PRIOR ART*  *PRIOR ART*
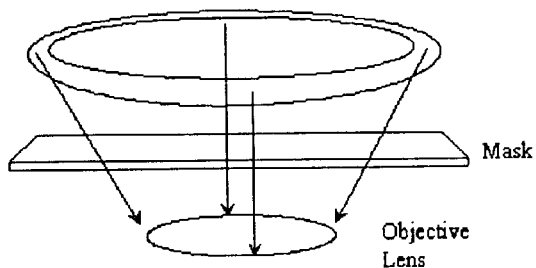
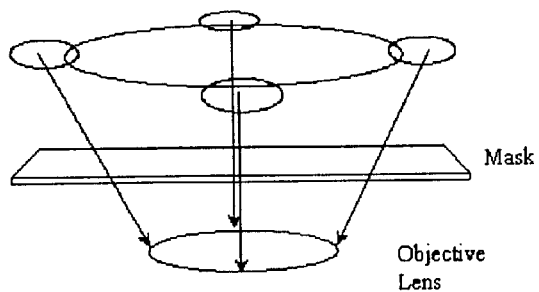
*FIG. 3*
*PRIOR ART*
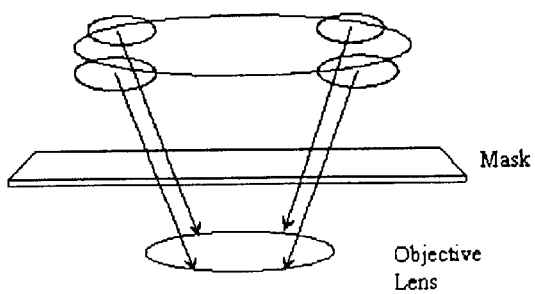

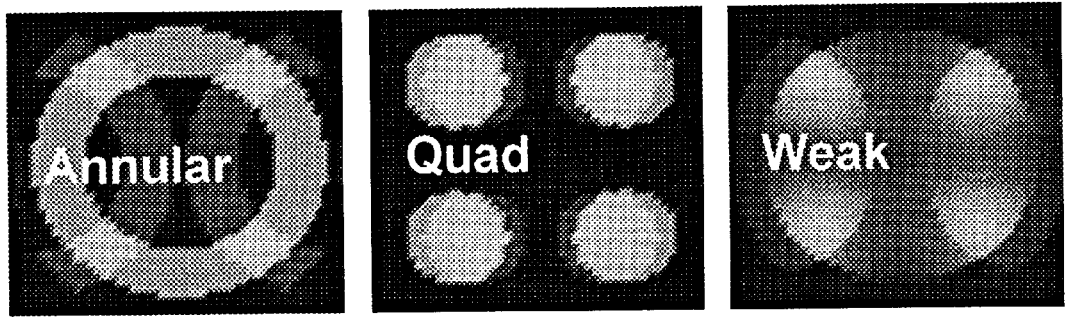
FIG. 4A
PRIOR ART
FIG. 4B
PRIOR ART
FIG. 4C
PRIOR ART
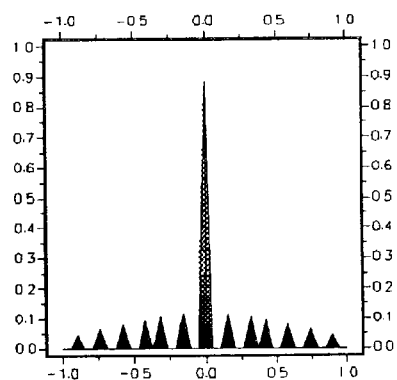 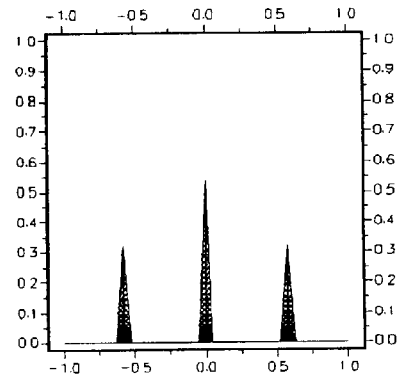
FIG. 5A
PRIOR ART
FIG. 5B
PRIOR ART
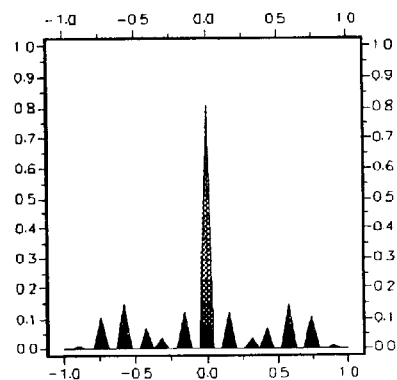 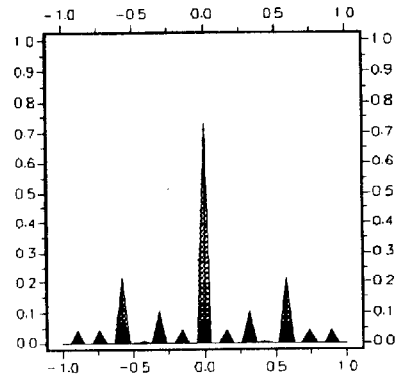
FIG. 5C
PRIOR ART

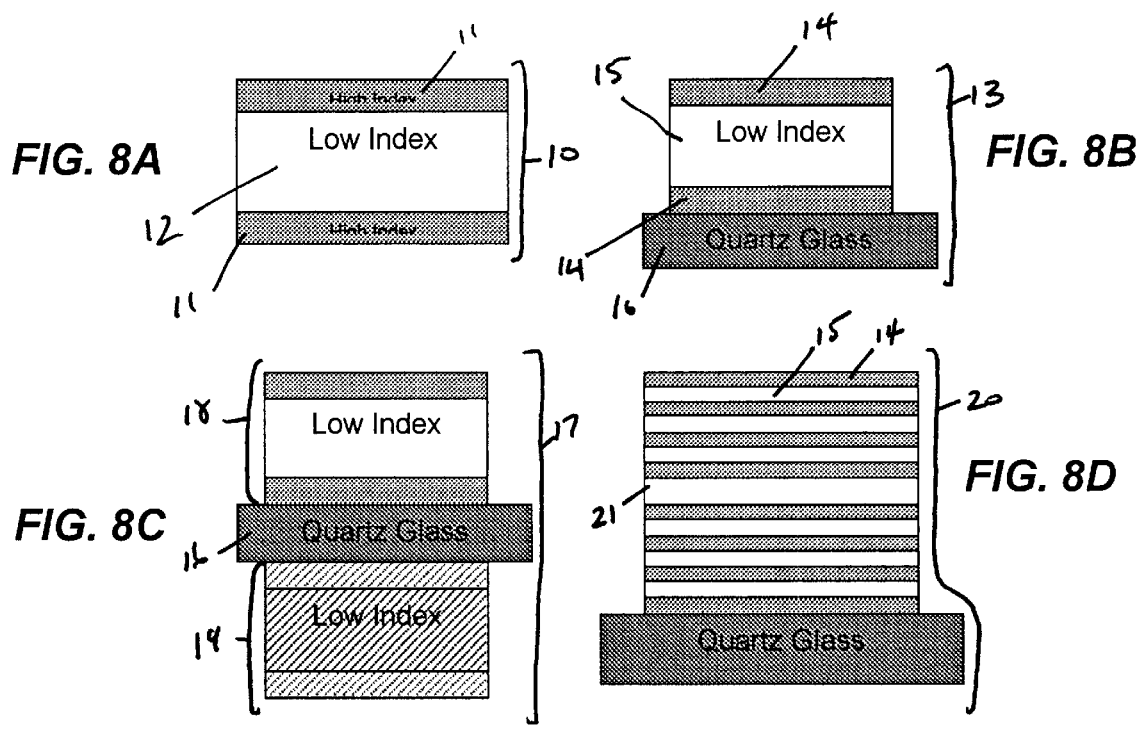
FIG. 8A
FIG. 8B
FIG. 8C
FIG. 8D
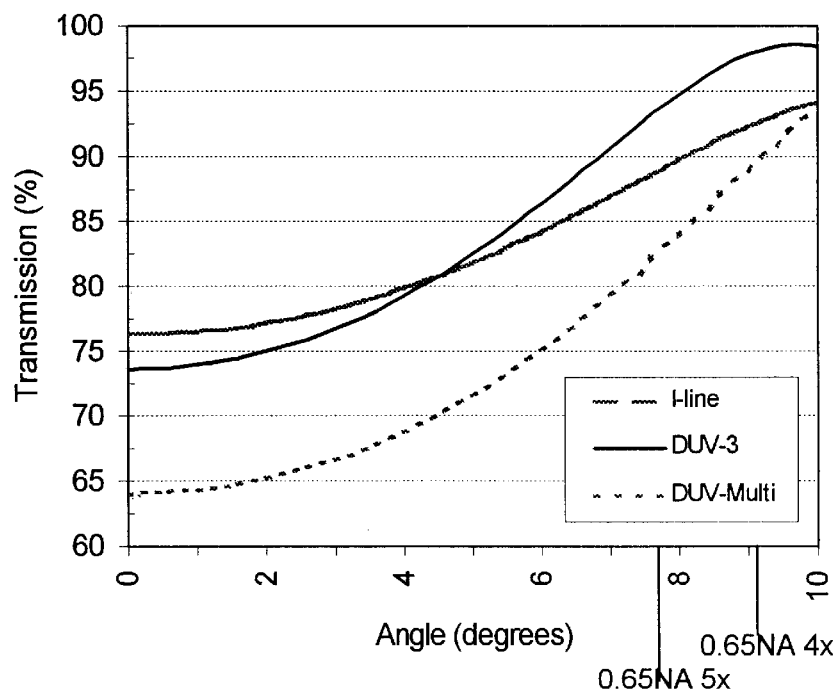
FIG. 9

APPARATUS AND METHOD OF IMAGE ENHANCEMENT THROUGH SPATIAL FILTERING

CROSS-REFERENCE TO RELATED APPLICATIONS

This is a conversion of U.S. Provisional Application Ser. Nos. 60/142,010 filed Jul. 1, 1999 and 60/196,621 filed Apr. 11, 2000. This patent claims the benefit of the priority dates of these U.S. applications.

FIELD OF THE INVENTION

The present invention relates to a method to form microlithographic images using a projection exposure system for fabricating semiconductor devices.

BACKGROUND OF THE INVENTION

Semiconductor lithography involves the creation of small three dimensional features as relief structures in a photopolymeric or photoresist coating. These features are generally on the order of the wavelength of the ultraviolet (UV) radiation used to pattern them. Currently, exposure wavelengths are on the order of 150 to 450 nm and more specifically 157 nm, 293 nm, 248 nm, 365 nm, and 436 nm. The most challenging lithographic features are those which fall near or below sizes corresponding to $0.5\lambda/NA$, where $\lambda$ is the exposing wavelength and NA is the objective lens numerical aperture of the exposure tool. As an example, for a 248 nm wavelength exposure system incorporating a 0.60NA objective lens, the imaging of features at or below 0.25 micrometers is considered state of the art. FIG. 1 shows the configuration of a projection exposure system. Such an exposure system can be used in a step-and-repeat mode (referred to a stepper tool) or in a step-and-scan mode (referred to as a scanner tool). A UV or vacuum ultraviolet (VUV) source 1 is used to pass radiation through the illumination system 2 using a condenser lens system 3 and a fly's eye microlens array 4. An aperture 5 shapes the illumination profile to a defined area and radiation is reflected from a mirror 6 to pass through an illumination lens 7 to illuminate a photolithographic mask 8. Upon illumination of the photomask 8, a diffraction field 11 distributed as spatial frequency detail of the photomask 8 is directed through the objective lens system 9 to be imaged onto the photoresist coated semiconductor substrate 10. Such an exposure system forms an image by collecting at least more than the $0^{th}$-order of the diffraction field from the photomask 8 with the objective lens 9. The absolute limitation to the smallest feature that can be imaged in any optical system corresponds to $0.25\lambda/NA$. Furthermore, the depth of focus (DOF) for such an exposure tool can be defined as $+/- k_2\lambda/NA^2$ where $k_2$ is a process factor that generally takes on a value near 0.5

As geometry sizes continue to shrink further below $0.5\lambda/NA$, methods of resolution enhancement are being required to ensure that intensity images (also known as aerial images) are produced with adequate fidelity and captured within a photoresist material. Such methods of resolution enhancement developed over recent years can allow for improvement in addition to those made possible with shorter exposing wavelengths and larger numerical apertures. These methods in effect work to control the weighting of diffraction energy that is used for imaging. This diffraction energy corresponds to the spatial frequency detail of a photomask. Phase-shift masking (PSM), off-axis illumination (OAI), and optical proximity correction (OPC) all lead to image enhancement through control of the weighting of diffraction energy or spatial frequency that is collected by an objective lens. As an example, an attenuated phase shift photomask accomplishes a phase shift between adjacent features with two or more levels of transmission [see B. W. Smith et al, J. Vac. Sci. Technol. B 14(6), 3719, (1996)]. This type of phase shift mask is described for instance in U.S. Pat. Nos. 4,890,309 and 5,939,227. Radiation that passes through clear regions of the such a mask possess a phase ($\phi$) that is dependant on the refractive index and thickness of the mask substrate. Radiation is also Transmitted through dark features formed in the attenuating material by proper choice of a material that has an extinction coefficient value generally less than 1.0. The radiation that passes though these dark features possesses a phase that depends upon the refractive index and extinction coefficient values of the mask substrate and of the attenuating material. It is chosen so that a 180 degree phase shift ($\Delta\phi$) is produced between clear regions and dark regions. Selection of a masking material with appropriate optical properties to allow both a 180 degree phase shift and a transmission of some value greater than 0% will reduce the amplitude of the zero diffraction order produced by illumination of the mask. Comparison of the resulting frequency plane distribution with that of a conventional binary mask can demonstrate this effect. The normalized zero diffraction order amplitude for a binary mask is 0.5 and the first order amplitude is $1/\pi$ as seen from FIG. 2A. Using a 10% attenuated phase shift mask, the normalized zero diffraction order amplitude is 0.4 and the first order amplitude is $1.1/\pi$ shown in FIG. 2B. This reduction in the zero diffraction order reduces the amplitude biasing of the higher order frequency components and produces an image amplitude function that has significant negative electric field energy. This leads to air aerial image intensity (which is the square of the amplitude image) that retains zero values at edges of opaque features. This edge sharpening effect leads to higher resolution when imaging into high contrast photoresist materials.

An attenuated phase shift mask requires a complex infrastructure of materials, deposition, etching, inspection, and repair techniques to replace the mature chromium on quartz binary photomask process. This field has been investigated for over ten years and it is not yet certain if suitable materials will exist for 248 nm, 193 nm, or shorter wavelengths. Stronger phase shift masking is difficult because of geometry, materials, and process issues and diffractive and scattering artifacts produced during imaging. As a result, it is questionable how practical phase shift masking will be for use in integrated circuit (IC) manufacturing.

Off-axis or modified illumination of a photomask can produce a similar frequency modifying effect [see B. J. Lin, Proc. SPIE 1927, 89, (1993) and see B. W. Smith, *Microlithography: Science and Technology*, Marcel Dekker: New York, Ch. 3, 235 (1998)]. FIG. 3 shows an example of the prior art, depicting illumination with an annulus and quadrupole illumination profiles. Definition of the shape of illumination can be carried out for instance in the position of the shaping aperture 5 shown in FIG. 1. Other methods of shaping can include the use of beam splitters, diffractive optical elements, or other optical approaches. Through the us, of such annular or quadrupole illumination, diffraction orders can be distributed in the objective lens 9 of FIG. 1 with minimal sampling of the central portion of the objective lens pupil. An example, is shown in FIGS. 4*a* through 4*c* for annular, quadrupole, and weak quadrupole illumination. The impact is similar to the reduction of the zero diffraction order or frequency produced with phase shift masking. In this case, the zero order takes on the shape of the illumination distribution in the condenser lens pupil. If appropriately designed, the central portion of the objective lens pupil can be avoided by diffraction energy.

Modified or off-axis illumination can suffer exposure throughput, orientation, and proximity effect problems. Contact mask features, for example, exhibit little improvement with off-axis illumination. Implementation is therefore limited for many applications, also limiting practicality.

The use of optical proximity correction (OPC) can also result in a reduction of zero order diffraction energy in the frequency plane. Methods of proximity effect reduction have been introduced which are comprised of additional lines, sometimes referred to as OPC assist features, into a mask pattern. This was first disclosed in U.S. Pat. No. 5,242,770. The patterning is such that an isolated line is surrounded by sub-resolution OPC assist line features on either side of the line, better matching edge intensity gradients of isolated features on the mask to more dense features on the mask. FIG. 5A shows the frequency plane distribution in the objective lens pupil for semi isolated lines (1:7 duty ratio) compared to the frequency plane distribution of dense lines (1:1 duty ratio), FIG. 5B. In addition to the increase in the number of diffraction orders present for the more isolated features (resulting from a larger pitch value than that for the dense features) a significant increase in the zero order term exists. Through the use of small assist features on each side of the isolated line, the amplitude of the zero diffraction order can be reduced as higher frequency content is increased, seen in FIG. 5C for one pair and for two pairs of assist features respectively.

OPC methods are limited by mask making capability for ultra small geometry and by limitations imposed by neighboring geometry. Implementation is especially difficult for geometry below 180 nm in size, limiting practicality.

Direct reduction of zero order diffraction energy within the lens and specifically in the lens pupil can be carried out by physically obscuring the central axial portion of the pupil. The concept of using such iii-pupil filters (also known as pupil-filtering) has been applied to various optical applications, where the result is a spatial frequency filtering effect. This has also been studied by various workers for application to semiconductor lithography (see W. T. Welford, J.O.S.A., Vol. 50, No. 8 (1960), 749 and see H. Fukuda, T. Terasawa, and S. Okazaki, J. Vac. Sci, Tech. B 9 (1991) 3113 and see R. M. von Bunau, G. Owen, R. F. Pease, Jpn. J. Appl. Phys., Vol. 32 (1993) 5850.). This in-pupil filtering has also been proposed in patents U.S. Pat. No. 5,595,857, U.S. Pat. No. 5,863,712, U.S. Pat. No. 5,396,311, and U.S. Pat. No. 5,677,757. The imaging characteristics for fine geometry (generally features at or below $0.5\lambda/NA$) have been shown to be enhanced through the use of various pupil filters. A simple example of the prior art is shown in FIG. 6, where a pupil filter 38 has a radiation-blocking portion 39 that blocks zero-order diffraction energy from passing through a central area of the filter and a radiation or radiation or light transmitting portion 40 that transmits diffraction energy at a peripheral area surrounding the radiation or light blocking portion 39. With respect to the projection imaging system of FIG. 1, such a prior art filter 14 is inserted into the pupil plane of the objective lens of the exposure system. By obscuring the central portion of the objective lens pupil, zero diffraction order energy is reduced. Opaque or partially transmitting (gray) obscuration of up to 70% of the pupil as well as more complex pupil filters have also been used where the spatial frequency filtering of the filter is customized for specific illumination and masking situations to meet certain imaging objectives. Implementation of such in-pupil filtering for semiconductor lithography is not practical or feasible because access to the objective lens pupil is difficult given the strict requirements placed on the objective lens performance. The filtering or obscuration of the objective lens pupil requires access to the pupil and a lens design robust enough to tolerate any phase, absorption, or flatness variations. It is unlikely that a permanent filtering value would be chosen for any lithography lens.

A practical solution of spatial frequency filtering is needed that can lead to the resolution and focal depth improvement that is difficult with other resolution enhancement methods. The ideal solution is one that could preserve most attributes of current manufacturable methods of lithography and allow the flexibility for application with many applications. Furthermore, a spatial frequency filtering solution that could be used together with other resolution enhancement methods could reduce demands on those methods to allow for their application.

SUMMARY OF THE INVENTION

The present invention is a unique approach to reducing zero diffraction order energy by spatial frequency filtering, in an alternative pupil plane, near the mask or the wafer planes and accessible to the user in a conventional lithography system. A conventional binary mask can be used with this approach. A conventional full circular pupil can be also used as the diffraction information is not filtered within the lens pupil. Furthermore, if combined with phase shift masking, modified illumination, or optical proximity correction. further improvement becomes feasible.

A goal of the presents invention is to provide a practical projection exposure method and apparatus that is capable of providing image improvement for a variety of fine lithographic features, including one-dimensional and two-dimensional geometry, in terms of both resolution and depth of focus by reducing the amount of zero order diffraction energy that is translated from a photomask and through the objective lens of a stepper or scanner system.

A second goal of the present invention is to provide a practical projection exposure method and apparatus that is capable of improving the performance of small contacts or via openings that are otherwise difficult to image using other resolution enhancement techniques.

A further goal of the present invention is to provide a practical projection exposure method and apparatus that is capable of providing means to improve the image forming characteristics of features that are different in their optical performance from one another so that images in photoresist can be created that are most favorable for all features at a single exposure value or across a small range of exposure.

An additional goal of the present invention is to provide a practical projection exposure method and apparatus that is capable of providing imaging improvement that can be implemented in an exposure system without significant modification to the system.

A still further goal of the present invention is to provide a practical projection exposure method and apparatus that is capable of providing for custom image modification based on the mask feature type, mask type, illumination, or other imaging condition and can be easily inserted or removed from an exposure system.

A still further goal of the present invention is to provide a practical projection exposure method and apparatus that does not introduce significant, measurable, or uncorrectable sources of error to an exposure tool, including uncontrollable effects from aberration, distortion, polarization, and defocus.

A still further goal of the present invention is to provide a practical projection exposure method and apparatus that can be specifically designed according to desired image forming properties of a mask feature type, mask type, illumination, or other imaging condition.

A still further goal of the present invention is to provide a practical projection exposure method and apparatus that allows for imaging improvement at one or more locations outside of the objective lens, where a single location or multiple locations may be used during imaging.

In order to accomplish the above described goals, spatial frequency filtering is carried out with the present invention at locations outside of the objective lens and at planes alternative to the objective lens pupil. This allows access to diffraction field energy or frequency information without requiring access to the physical lens pupil. Alternative pupil planes are located close to object and image planes, or mask and semiconductor substrate planes respectively. At predetermined distances from these positions, separation is sufficiently far so that angular specific spatial frequency filtering devices placed at these locations will selectively act on frequency content of an image rather than spatial content (i.e. positional or distance). A filter is provided that controls transmission as a function of angular properties of the diffraction field from the photomask geometry. The filter consists of coatings of predetermined transparent materials at predetermined thicknesses on a transparent substrate so that normal or near normal incident radiation passes through the filter attenuated by a predetermined amount while radiation at more oblique angle passes unattenuated or weakly attenuated. The angular transmission properties of the filter act on the spatial frequency content of the photomask patterns and resulting images, where zero order diffraction field energy is attenuated to the largest degree.

Additionally, the present invention provides a method to hold the filtering device or devices at the predetermined separation distances. One aspect of the present invention provides a spacing element which consists of a fixed ring of a width corresponding to the required separation distance which is fixed to both the photomask and to the filter, holding the filter at the required separation distance. Alternatively, the projection exposure apparatus is provided with an optical changing member for selecting one of a number of a plurality of filters that provide preferred image modification for at least one optical characteristic of the photomask features. Alternatively, the filter is secured at the bottom most position of the objective lens column, closest to the image plane of the exposure system.

BRIEF DESCRIPTION OF THE DRAWINGS

FIGS. 2A, 2B, and 2C show the distribution of diffraction energy for (A) conventional illumination, (B) strong phase shift mask, and (C) attenuated phase shift mask.

FIG. 3 shows several prior art arrangements for modified off-axis illumination for a projection lithography system including annular and quadrupole configurations.

FIG. 4A, 4B, and 4C show the distribution of diffraction energy for (A) annular, (B) quadrupole, and (C) weak quadrupole illumination.

FIG. 5A shows the diffraction patterns for semi-isolated lines.

FIG. 5B shows the diffraction patterns for dense lines

FIG. 5C shows the comparison of the diffraction patterns of semi-isolated lines with one pair (right) and two pairs (left) of OPC assist lines.

FIG. 8A, 8B, 8C, and 8D show the angular transmission spatial frequency filter design types.

FIG. 9 is a graph showing performance of a frequency filter designs for 248 nm and 365 nm.

DETAILED DESCRIPTION OF THE INVENTION

Features on an IC photomask are generally near the diffraction limit and may be sub-wavelength in size for lens numerical aperture values near or above 0.6. Spatial filtering of zero diffraction order energy will effectively reduce the amplitude biasing of the limited number of diffraction orders that are captured by the objective lens of a stepper or scanner. When the zero diffraction order is reduced, the amplitude at the boundaries of opaque features is forced to zero and edges of opaque features can be enhanced. This effect can be maintained through image defocus or with other lens wavefront aberration.

First Embodiment of the Invention

Spatial frequency filtering is carried out in a Fourier transform plane of an object. Such a plane is defined where the electric field M(u,v) takes on the form in spatial frequency as:

$$M(u, v) = \int_{-\infty}^{\infty}\int_{-\infty}^{\infty} m(x, y) e^{-2\pi i(ux+vy)} dx dy$$

where m(x,y) is the mask object function. Although the objective lens pupil is in the Fourier transform plane of the photomask, it shares this characteristic with other alternative positions within the system. An equivalent plane for mask diffraction for instance is in the far field or Fraunhofer diffraction region of the photomask. Although the Fraunhofer diffraction region is defined as an infinite separation distance (z) from an object, more practically it exists at a sufficient distance from the photomask object plane defined as:

$$|z| \gg \frac{\pi L_1^2}{\lambda}$$

where $L_1$ is the maximum radial extent of the object features (x, y):

$$\sqrt{x^2+y^2} > L_1$$

A factor of 10 is commonly used to satisfy the "much greater than" condition for separation distance. For the case of IC photomask geometry on the order of a few hundred nanometers, the requirements of the minimum distance for Fraunhofer diffraction are met by a factor of $10^3$ or more at a distance of a few millimeters. Filtering at this location therefore operates in the Fraunhofer diffraction field of the mask object and any filtering done in this region will act on the angular spatial frequency content of the object. By placing an angular specific optical frequency filter at this location, the desired effect is produced where zero order diffraction energy is reduced. while higher order diffraction energy passes. The consequence to imaging is image sharpening, improved resolution, and increased focal depth.

Figure 1:
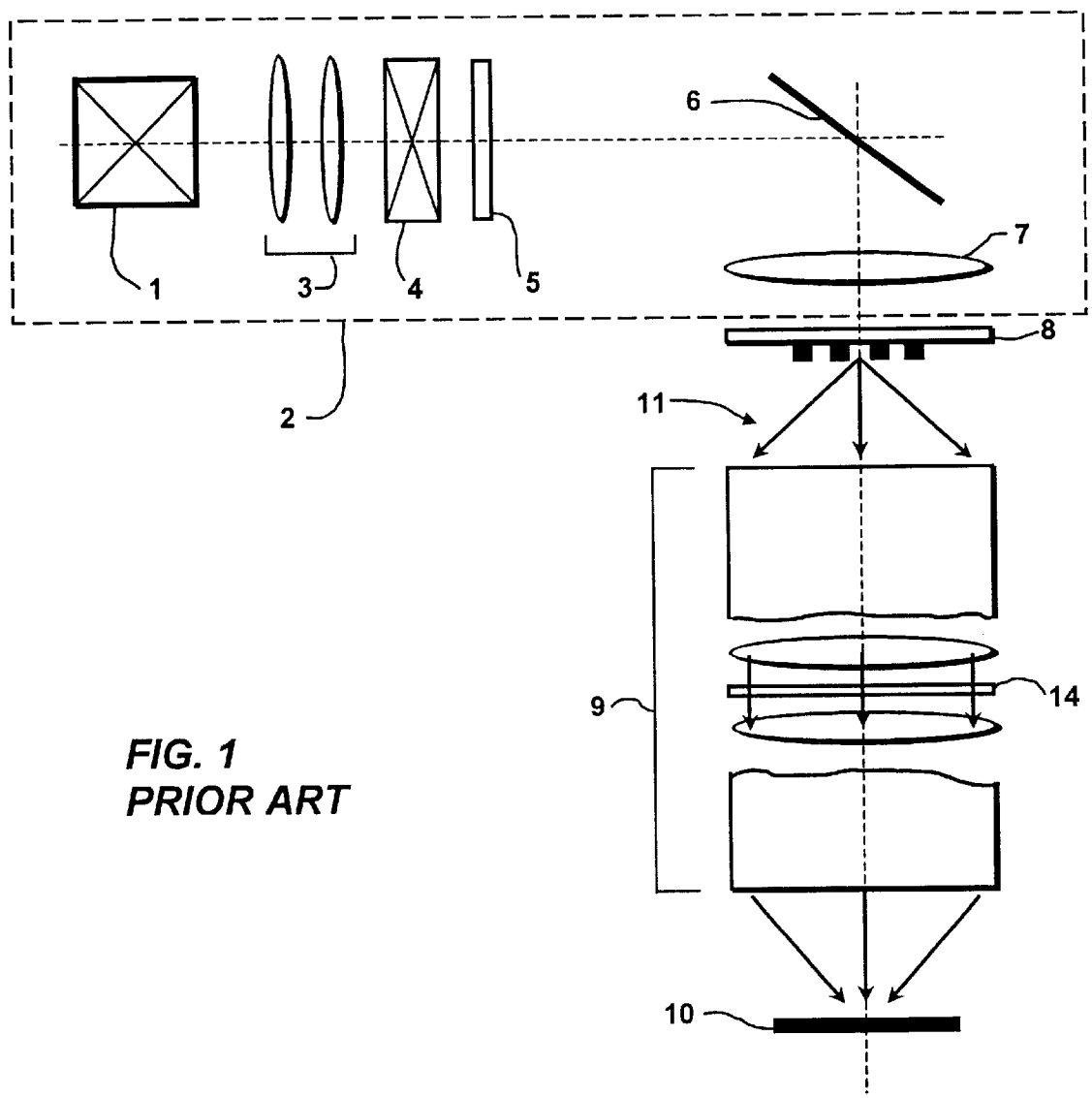
FIG. 1 is a schematic of a projection exposure system used for semiconductor lithography.
Figure 6:
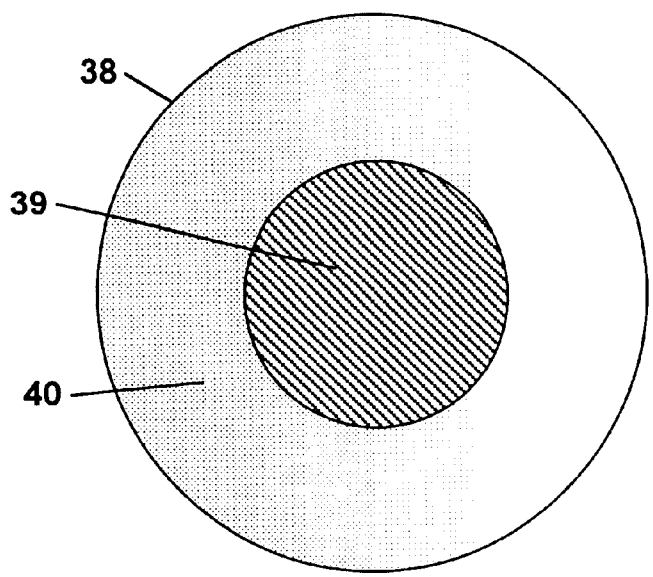
FIG. 6 is an example of a prior art in-pupil radiation blocking filter.
Figure 7:
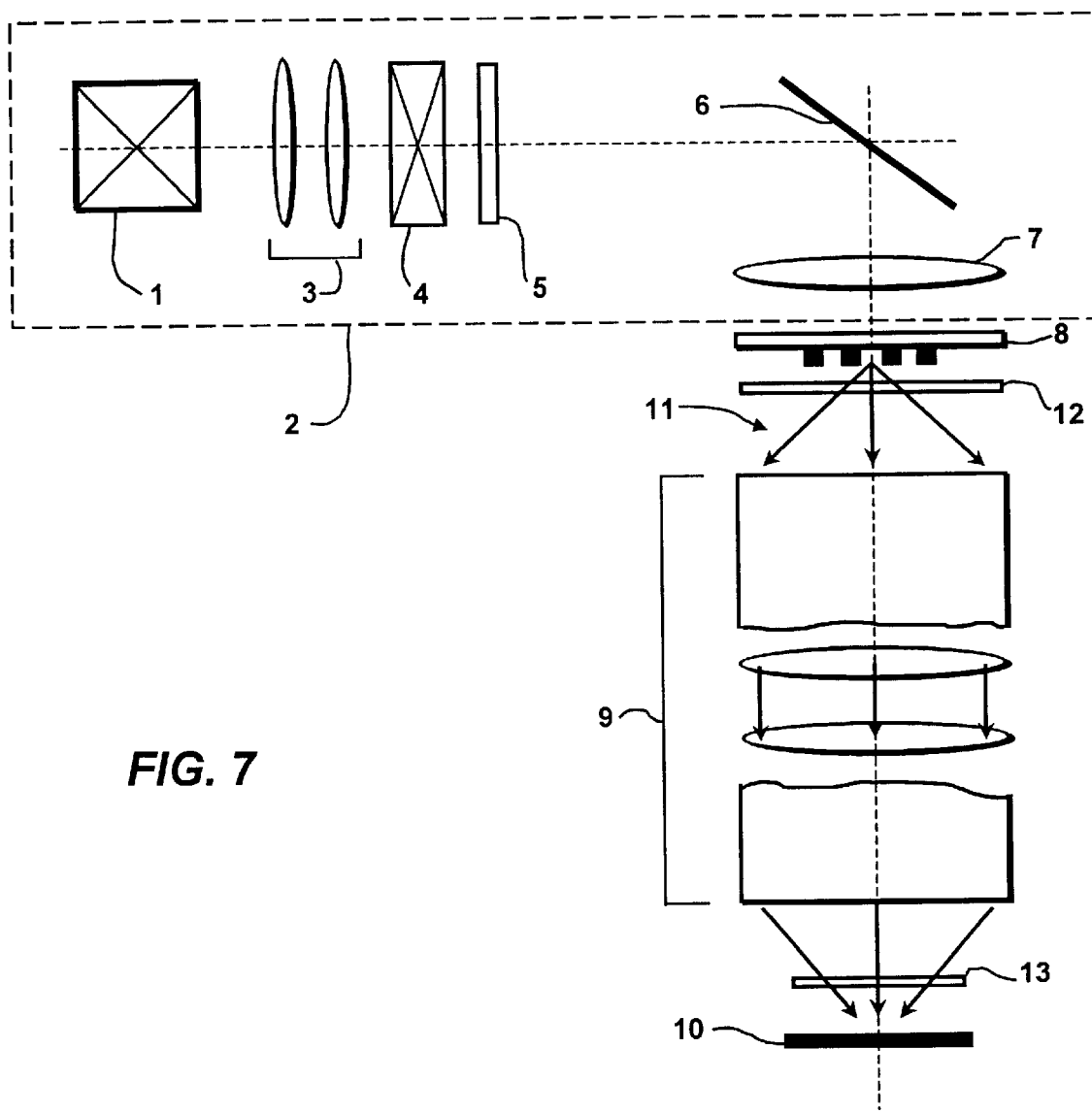
FIG. 7 shows the arrangement of the projection exposure system according to the present invention.

One embodiment of the present invention provides a projection exposure system as shown in FIG. 7. A UV or VUV source 1 is used to pass radiation through the illumination system 2 by a condenser lens system 3 and a fly's microlens array 4. An aperture 5 shapes the illumination profile to a defined area and radiation is reflected from a mirror 6 to pass through an illumination lens 7 to illuminate a photolithographic mask 8. Upon illumination of the photomask 8, a diffraction field 11 is directed through the objective lens 9 to be imaged onto the photoresist coated semiconductor substrate 10. The projection exposure system is further provided with a filter 12 that lies outside of the objective lens 9 and at a predetermined distance from the photomask 8.

The filter 12 of this invention comprises a coating or coatings on a transparent substrate such that transmission is controlled though the filter based on angle of incidence where normal or near normal illumination is attenuated greater than more oblique illumination. The filter is placed in the optical train of a lithographic stepper or scanner in a Fourier Transform plane of the object and image planes. These object and image planes correspond to photomask and wafer planes respectively in a lithographic exposure system.

The angular specific spatial frequency filter for the filtering of the present invention comprises a substrate with ore or more coatings of inorganic, organic, or combined thin film materials. Filter designs in UV wavelengths ranging from 150 nm to 450 nm require unique material types and designs, however the present invention is not necessarily limited to these wavelengths and solutions for shorter or longer wavelengths are possible. The filter is designed to provide maximum transmission at angles corresponding to first diffraction orders of features resolvable with the highest numerical aperture (NA) of a given system. This corresponds to $\lambda/p \sim NA$ or about 44 degrees for a 0.70NA system. When the optical reduction of a projection stepper or scanner is taken into account, this angle may be ¼ or ⅕ of this value.

Angular Transmission Designs

The frequency filters of and for use with the present invention require the specific design of interference properties within a thin film or thin film stack across a spectral range. The required components of a self supporting filter include a transparent substrate and suitable transparent optical thin film coating materials. In some instances, the substrate may also act as an optical interference layer if its thickness is taken into account during design and if the wavelength or spectral bandwidth of the illumination source is sufficiently small. The simplest type of periodic system is a quarter wave stack, a periodic structure of alternately high (H) and low (L) refractive index materials with low absorbance. Designs generally take on a form denoted as $s(HL)^N$ where s is the substrate material and N is the periodicity factor, an integer equal to or greater than 1. This unique variation of the periodic design for this application is the angular interference filtering, where transmission is separated in angle. The filter is designated for instance as s[HLH (LL) HLH] where the central portion of the stack (LL) corresponds to the interference cavity. The thickness of the cavity is designed so that interference at normal incidence leads to minimum transmission values and transmission at oblique angles is maximized. FIGS. 8A through 8D show several designs. FIG. 8A shows a simple angular interference filter design 10 based on high index coatings 11 on each side of a thick low index material 12. In this case, the low index material is the substrate itself of a predetermined thickness, which can be an amorphous or crystalline glass, fused silica, or fluoride-based plate or a transparent organic polymeric coating, such as a fluoropolymer or other transparent polymeric material. FIG. 8B shows a dielectric design 13 that could be utilized with inorganic dielectric high index materials 14 and low index materials 15 coated over a fused silica substrate 16. FIG. 8C is a double sided design 17 where the front side coating 18 is replicated on the back side of a substrate 19 to further reduce transmission at normal incidence, and FIG. 8D is a hybrid multilayer design 20 using a low index dielectric interference cavity 21.

The angular differences in optical path distances give rise to the desired transmission characteristics of the interference filters. To accomplish the goals of these filters, the optical properties of materials and coatings must be well characterized at the wavelength of operation. Additionally, since interference relies on material optical thickness', films need to be controlled to within $0.02\lambda/n_i$ (where $n_i$ is refractive index). This correlates to physical thickness values of few nm for lithographic wavelengths.

Fabrication of the filter coatings requires the use of UV and VUV spectroscopic ellipsometry to characterize organic and inorganic materials for use as high and low index materials. A Woollam WVASE VUV spectroscopic ellipsometer was used to extract optical properties of a variety of transparent materials suitable for use in these filters including inorganic oxide dielectrics such as hafnium oxide ($HfO_2$), silicon dioxide ($SiO_2$), and aluminum oxide ($Al_2O_3$) and fluoride dielectrics such as magnesium fluoride ($MgF_2$), lanthanum fluoride ($LaF_3$), strontium fluoride ($SrF_2$), hafnium fluoride ($HfF_4$), barium fluoride ($BaF_2$), gadolinium fluoride (GdF), lithium fluoride (LiF), yttrium fluoride ($YF_3$), boron oxide ($B_2O_3$), chromium fluoride ($CrF_3$), neodymium fluoride ($NdF_3$), phosphorous oxide ($P_2O_5$), and ytterbium fluoride (YbF). The refractive index ($n_i$) and extinction coefficient (k) properties are shown in Table 1 at lithographic wavelengths (365 nm, 248 nm, 193 nm, and 157 nm) below.

A variety of organic materials have also been characterized including transparent polymer materials such as fluoropolymers and nitrocellulose.

As an example, inorganic filters have been designed and fabricated for use at a 248 nm wavelength using hafnium dioxide ($HfO_2$) films with a refractive index of 2.3215 and an extinction coefficient of 0.00028 as a high index material combined with silicon dioxide ($SiO_2$) as a low index material with a refractive index of 1.480 and a near-zero value extinction coefficient. Organic filters have also been designed for 248 nm and 365 nm using a nitrocellulose film as a high index material with a refractive index of 2.007 at 248 nm and 1.704 at 365 nm and a fluoropolymer film as a low refractive index material with refractive index of 1.521 at 356 nm and 1.602 at 248 nm. Filter designs are those of types B, C, and D in FIG. 8. All inorganic materials have been coated onto fused silica substrates. Organic filters are stand-alone types, utilizing the polymeric films themselves as support layers and requiring no additional support substrate.

FIG. 9 shows the angular transmission results for three filter designs using materials characterized for use in the UV/VUV wavelength region. Transmission is plotted as a function of angle at the mask side of the imaging system. The designs and layer thicknesses are shown in Tables 2a and 2b below.

TABLE 2a

Angular filter designs

|   | DUV-MULTI | DUV-3 | I-LINE |
|---|-----------|-------|--------|
| H | 32 nm | 32 nm | 52 nm |
| L | 1243 | 2548 | 2841 |
| H | 44 | 41 | 52 |
| L | 1227 | | |
| H | 46 | | |

TABLE 1

| Material | 157 nm n | 157 nm k | 193 nm n | 193 nm k | 248 nm n | 248 nm k | 365 nm n | 365 nm k |
|---|---|---|---|---|---|---|---|---|
| Al2O3 | 2.070 | 0.0321 | 1.8942 | 0.0040 | 1.8283 | 0.0000 | 1.7927 | 0.0000 |
| B2O3 | 1.761911 | 0.08833154 | 1.643061 | 0.08630061 | 1.687062 | 0.08432748 | 1.806547 | 0.08227224 |
| BaF2 | 1.654013 | 0.03754984 | 1.561748 | 0.0153238 | 1.504007 | 0.006285364 | 1.468147 | 0.002429049 |
| CrF3 | — | — | 2.2052 | 0.0983 | 1.9831 | 0.0654 | 1.8087 | 0.0411 |
| GdF3 | — | — | 1.6602 | 0.0392 | 1.5957 | 0.0278 | 1.5600 | 0.0192 |
| HfF4 | 1.870596 | 0.1215669 | 1.737489 | 0.04166171 | 1.659593 | 0.01436462 | 1.615425 | 0.004612696 |
| LaF3 | — | — | 1.6702 | 0.0907 | 1.6321 | 0.0609 | 1.5922 | 0.0398 |
| LiF | — | — | 1.4172 | 0.0054 | 1.4314 | 0.0043 | 1.4050 | 0.0031 |
| MgF2 | 1.474716 | 0.06745632 | 1.418481 | 0.0465574 | 1.389212 | 0.03220084 | 1.375647 | 0.02172941 |
| NdF3 | 1.715155 | 0.09490583 | 1.646496 | 0.02527772 | 1.581322 | 0.007026228 | 1.52356 | 0.001759475 |
| P2O5 | 1.7432 | 0.0932 | 1.6433 | 0.0929 | 1.6199 | 0.0932 | 1.5877 | 0.0832 |
| SrF2 | 1.534777 | 0.1191028 | 1.472364 | 0.05597903 | 1.422627 | 0.02642328 | 1.383426 | 0.0118622 |
| YbF3 | 1.708709 | 0.07583188 | 1.638029 | 0.0451999 | 1.600526 | 0.0270207 | 1.582476 | 0.01560728 |
| YF3 | 1.621849 | 0.0288452 | 1.549471 | 0.02145819 | 1.520605 | 0.01598972 | 1.515468 | 0.01168297 |
| HfO2 | — | — | 2.62411 | 0.2190 | 2.3215 | 0.00028 | 2.14942 | 0.00000 |
| SiO2 | 1.6702 | 0.00003 | 1.5632 | 0.00000 | 1.4800 | 0.00000 | 1.47472 | 0.00000 |

TABLE 2b

Material for filter designs

|   | DUV (n,k) | I-LINE (n,k) |
|---|-----------|--------------|
| H | HfO2 (2.3215, 0.00028) | PVN (1.704, 0.013) |
| L | SiO2 (1.48, 0.00) | Fluoro (1.363, 0.00) |

Figure 10:
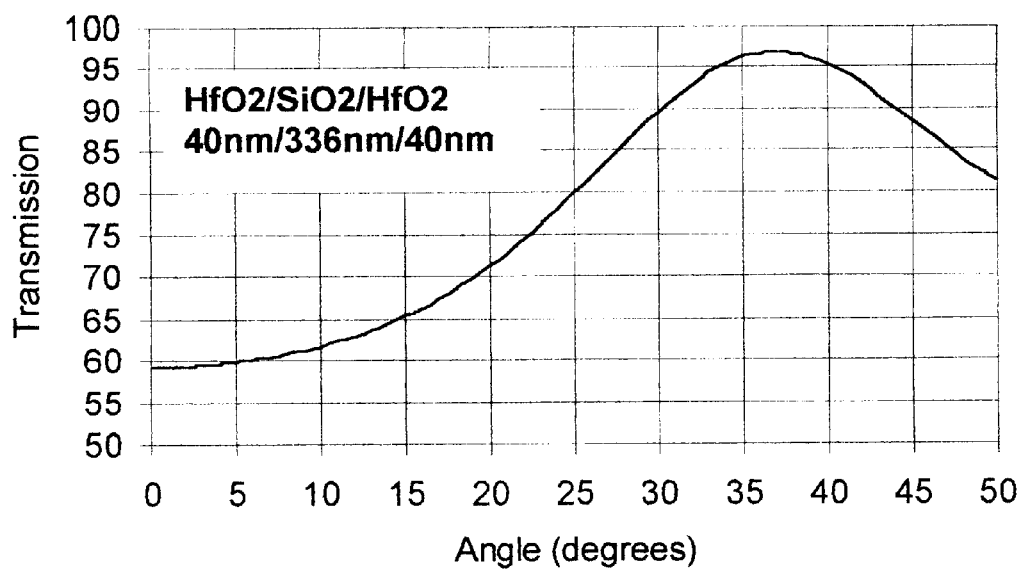
FIG. 10 is a graph showing performance of a fused silica angular frequency filter designed to operate with large angles.

For a 0.65NA 5X system, this angle corresponds to $\sin^{-1}(0.65)/5$ or 8.11°. For a 4X system, this is 10.13°. Theses values correspond to the maximum diffraction angle that can be captured with a given NA (for coherent illumination or for partially coherent illumination spread by σ). As the maximum oblique diffraction angle is increased, either through higher NA or through lower reduction factors, the thickness of the cavity layer can be decreased, thus allowing for normalized transmission differential values above 30%. An example is shown in FIG. 10 where a filter has been designed using a fused silica substrate to operate with maximum transmission at angles between 35° and 45°, which would correspond for instance to high NA (0.57 to 0.71) in a situation where reduction does not occur.

Figure 11:
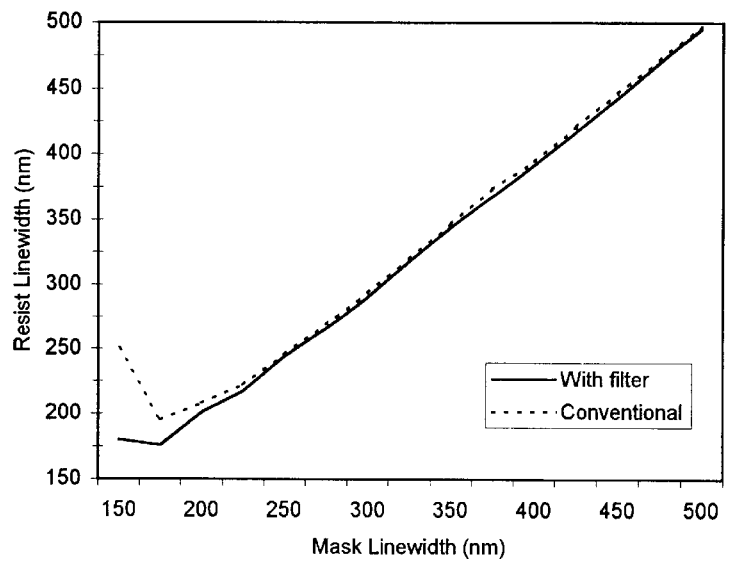
FIG. 11 is a linewidth linearity plot comparing results with a without an angular frequency filter.

When an angular frequency filter is incorporated into an exposure system, producing lower transmission at normal incidence compared to more oblique angles, zero order diffraction energy can be reduced. An added benefit that can be realized using this spatial frequency filtering is a potential increase in critical dimension (CD) linearity as feature pitch changes. It is well understood that as mask feature pitch values are decreased, high frequency diffraction energy is lost, leading to loss in image fidelity. There is an additional effect that occurs that leads to further loss in CD linearity, namely the reduction of total energy in the lens pupil with decreasing pitch values. The linearity plot of FIG. 11 depicts the situation for dense (1:1) line geometry ranging from 500 nm to 150 nm in a 248 nm lithography system with a 0.61 NA and 0.7 σ. As mask feature size is decreased, an increase in resist feature sizing occur;, with a positive photoresist. By decreasing the energy in the center of the pupil, through the angular spatial frequency filtering of the present invention, CD linearity can be increased for a greater range of feature values. The linearity plot of FIG. 11 also contains this result, where the resist feature sizing remains more constant as mask feature size is decreased.

The advantage of spatial filtering in a plane near the photomask is the accessibility it allows the user. Where conventional pupil plane filtering would require major modifications to an exposure tools optical system, this approach can immediately be put to practice. Additionally, the flexibility .f this approach allow for customizing of frequency filtering based on mask and imaging requirements.

Figure 12:
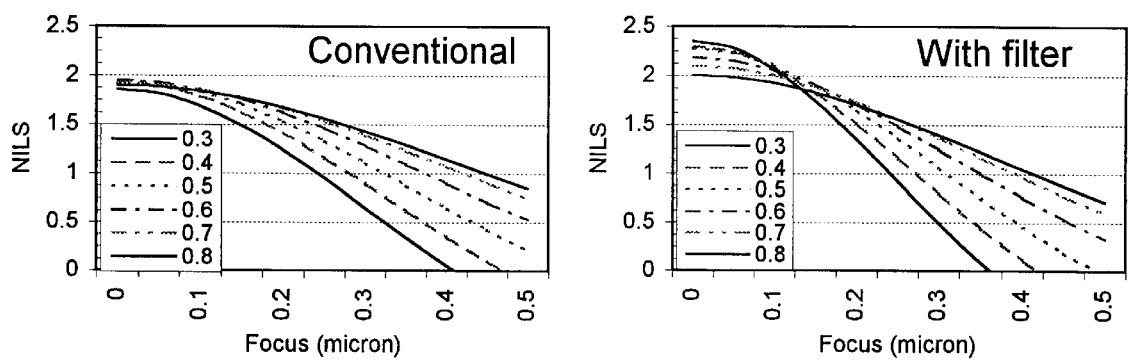
FIG. 12 show aerial image simulations for 150 nm 1:1.5 lines using 248 nm wavelength and 0.63NA. Results in FIG. 12 are for conventional imaging and results in FIG. 12 are for imaging with a 25% filter.
Figure 13:
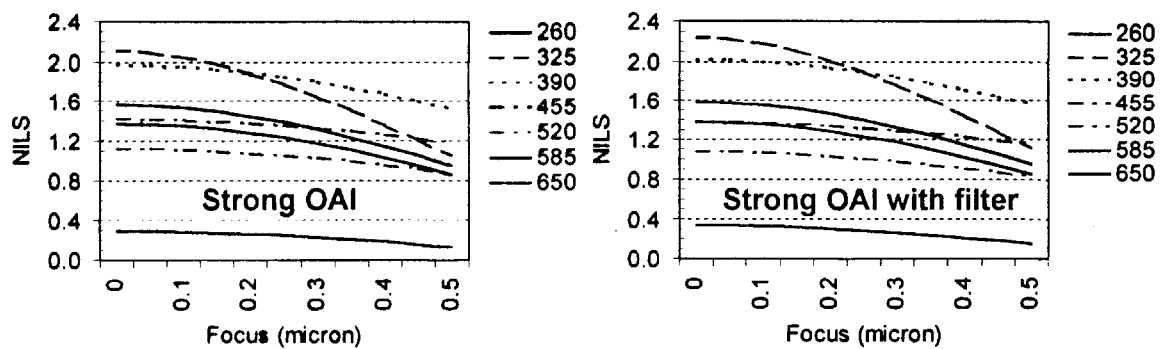
FIG. 13 shows aerial image. simulations for strong off-axis illumination combined with the filtering of the present invention. Results on the left are for conventional imaging and results on the right are for imaging with a 25% filter.
Figure 14:
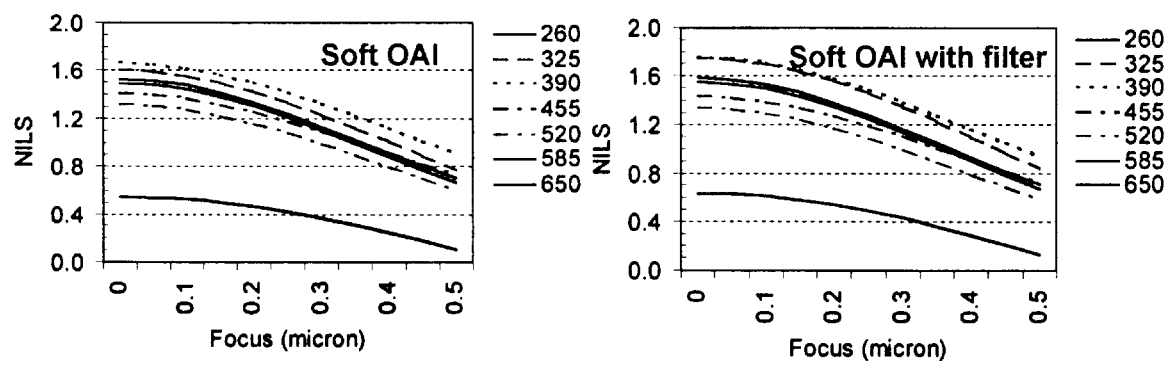
FIG. 14 shows aerial image simulations for weak off-axis illumination combined with the filtering of the present invention. Results on the left are for conventional imaging and results on the right are for imaging with a 25% filter.
Figure 15:
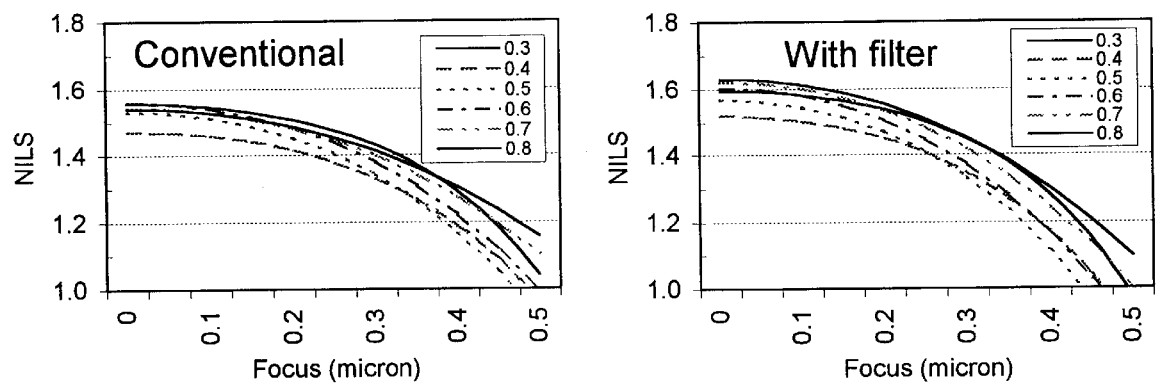
FIG. 15 shows aerial image simulations for 160 nm 1:1.5 contacts using 248 nm wavelength and 0.63NA. Results on the left are for conventional imaging and results on the right are for imaging with a 25% filter.
Figure 16:
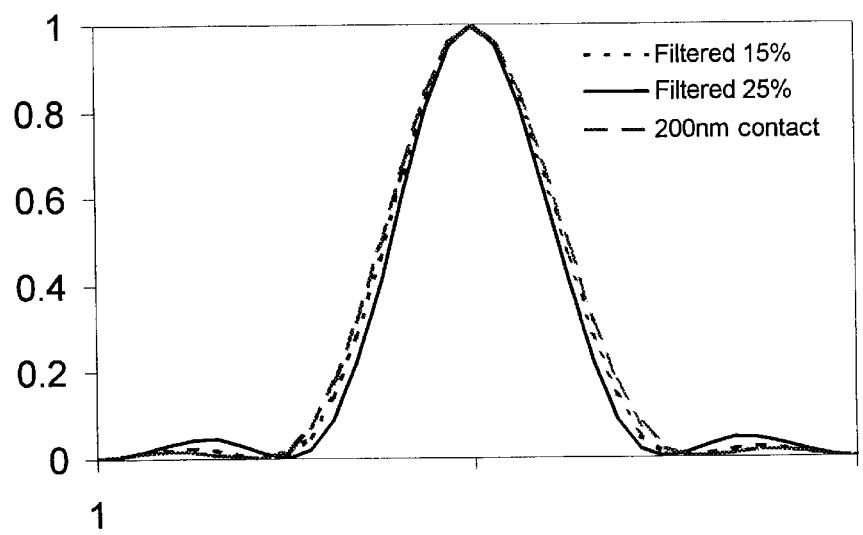
FIG. 16 is a graph that shows the image plane distribution for contact with and without filtering.

The benefits to imaging with this invention are realized through the examination of lithographic results. A high-NA scalar model was used to simulate lithographic imaging (using PROLITH/2 from FINLE Technologies, Version 6.05) for 150 nm semi-dense lines (1:1.5) using a 248 nm wavelength and a 0.63NA. Aerial images were evaluated by measuring normalized image log slope (NILS—the product of the log of the slope of the aerial image and the feature size) through focus for a range of partial coherence values from 0.3 to 0.8. Preferably, NIL's values should be large. Results with a 25% frequency filter, based on the DUV-3 design shown in FIG. 9, were incorporated into the model and compared to results without a filter, which are shown in FIG. 12. There is improvement for all conditions of partial coherence and maximum improvement occurs at lower sigma values. This is expected based using coherent illumination analysis. An added benefit of the present invention is the improvement that it exhibits to imaging with modified illumination. such as off-axis illumination. FIG. 13 shows results comparing aerial images of 130 nm features produced with strong off-axis illumination both with and without the spatial frequency filter of this invention. For all pitch values shown, the filtered result is superior to the non-filtered result. FIG. 14 show similar improvement for these lines imaged with weaker or "soft" off-axis illumination, where the circular poles of a quadrupole source illumination have been replaced with gaussian shapes. A similar comparison was made for 160 nm 1:1.5 contacts, shown in FIG. 15 where a 35% improvement in DOF is realized for the filtered situation verses conventional imaging. The situation for contacts is unique compared to line features, warranting further description. For small contacts, the diffraction pattern overfills the objective lens pupil. The resulting image of the contact more closely resembles the transform of the pupil (the point spread function) than it does the intended contact. The result is the characteristic side-lobes or ringing seen for small contacts especially at very low partial coherence values. The situation is made worse however from the falloff within then lens pupil that results from the product of the pupil with the contact diffraction pattern. Contact image widening results. If the falloff within the lens pupil could be reduced, additional confinement in the contact image size would result and features could be printed smaller. This can be accomplished using pupil filtering with a character that resembles the inverse of the falloff within the lens pupil. This is precisely what is carried out by using the frequency filtering approach described here. The falloff for a $k_1=0.5$ contact at the edge of the pupil is 65%. A frequency filter with near 65% attenuation at the center of the field, would therefore be desirable. Coherent analysis of a 200 nm contact using a 248 nm wavelength and a 0.63NA is shown in FIG. 16. Filtering with a 25% filter leads to measurable reduction in contact size. Together with the enhancement described earlier, the potential improvement for contact level lithography using the frequency filter is significant.

An interference filter placed into the optical path of a projection system becomes an optical element and any impact on the lithographic process may not be negligible. The challenge is to address potential source of errors and design systems that minimize these errors. There are four areas that may be a concern when using filtering devices, specifically added wavefront aberration, focus shift, polarization effects, and distortion.

The spatial frequency filter of the present invention is essentially a parallel plate optical component, coated appropriately to produce desired interference results. Imaging through a parallel plate results is image displacement (described later in detail), but its impact is not limited to this effect. By applying aberration theory of two surfaces, imaging and aberration results can be evaluated [see V. Mahajan, Aberration Theory Made Simple, SPIE Press, Vol TT (1991) 30]. The wavefront aberration function through the two surfaces of the plate can be written as:

$$W(\rho,\theta;h)=\alpha(\rho^4-4h\rho^3\cos(\theta)+4h^2\rho^2\cos^2\theta+2h^2\rho^2-4h^3\rho\cos\theta)$$

Where h is the separation of an object point from the optical axis, α is the weighted aberration coefficient, and ρ is the normalized radius of the pupil. The five terms of the function describe spherical, coma, astigmatism, defocus, and tilt respectively. For coherent or for symmetrical illumination, all terms of the wavefront aberration function drop out except for spherical. For a parallel plate, the aberration coefficient a is:

$$\alpha = \frac{t(n^2-1)}{8n^3S^4}$$

where t is the plate thickness, n is refractive index and S is the separation distance form the mask. The wavefront aberration function becomes:

$$W(\rho,\theta,0) = \frac{t(n^2-1)}{8n^3S^4}\rho^4$$

For a 3 mm separation, a refractive index of 1.5, and a 2 μm thick filter, the induced Seidel spherical aberration is 1/5000 wave. For a 0.5 mm quartz plate, 1/20 wave of spherical aberration is added. Although 1/20 wave is not a negligible amount of spherical wave by today's lithographic requirements, sufficient adjustment and compensation ability exists on current tools to correct for this level of aberration. This is therefore not a critical concern.

When a parallel plate is placed in an optical path, a shift in focus occurs due to a change in optical path length. While the lens numerical aperture does impact this effect, its contribution is minor and the shift at the mask plane can be approximated by:

$$\delta f = t(n-1)/n$$

where δf is the focus shift. In general, a mask plane focus shift of about one third of the thickness of a filter of index 1.5 is produced, which is also easily correctable in the exposure tool at the wafer plane.

Figure 17:
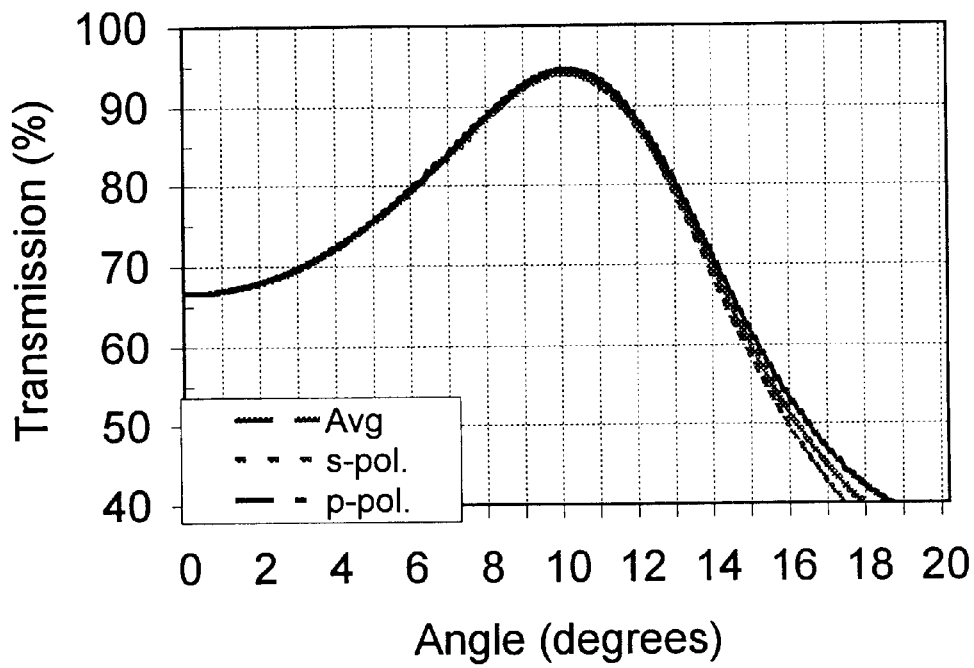
FIG. 17 is a graph that shows the polarization effects of a typical frequency filter on a quartz substrate.

At large angles, polarization effects by reflection (or transmission) begin to become significant. As angles approach Brewster's angle, polarization increases. For the case of an interference filter, the process is repeated through the multilayer stack. FIG. 17 is a plot of a typical frequency filter interference coating at angles to 20 degrees (equivalent to an NA near 1.0 for a 4X or 5X system. Only at angles greater than 13° (equivalent to an NA of 0.79 for a 4X system) do polarization effects become noticeable, where s and p polarization states exhibit different transmission properties. This is less of a concern in a system utilizing polarized or partially polarized radiation. Modified filter designs can push this maximum angle out to near 18°.

For single telecentric systems, distortion will be caused as radiation or light travels through a parallel plate in the mask pellicle plane. The degree of distortion depends on the refractive index and thickness of the plate, magnification, and the maximum ray angle through the plate. This potential problem is eliminated with respect to current lithographic requirements with the dominance of modem double-telecentric steppers and scanners.

In general, the errors induced by use of this invention in a lithographic application are all within the control of modern tools and imaging systems and present no issues for the implementation of this technology.

Filter Fabrication

Figure 18:
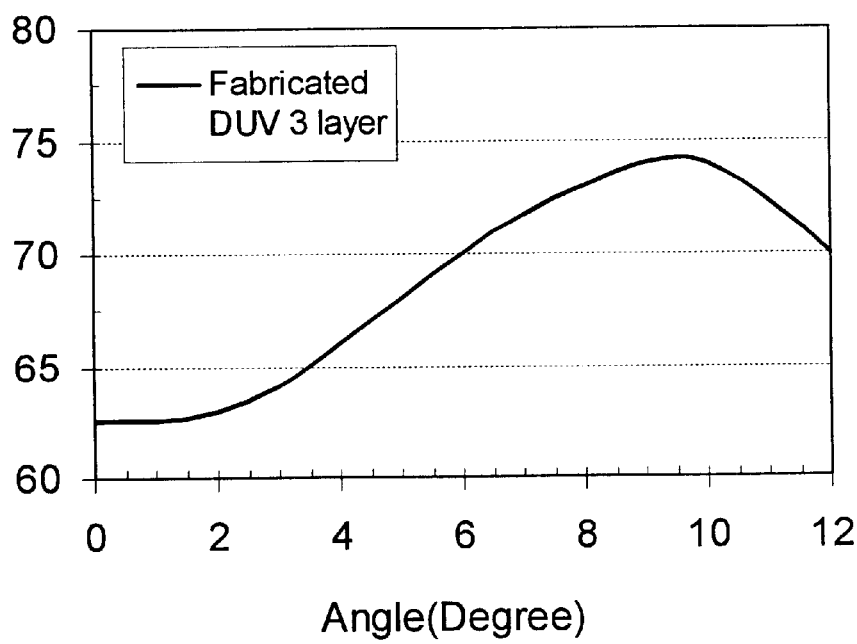
FIG. 18 is a plot of the transmission verses illumination angle of a fabricated angular frequency filter.

Fabrication of spatial frequency filters has been carried out for application at DUV (248 nm) exposure as inorganic multilayer stacks on fused silica substrates. Substrates were 4" diameter round high quality UV fused silica polished to a ~0.5 mm thickness. Optical properties (ni, k, and transmission) were measured and fitted for these substrates using a Woollam UV/VUV spectroscopic ellipsometer (WVASE) for wavelengths from 190 to 500 nm, resulting in a refractive index at 248 nm of 1.480 and a zero extinction coefficient. Three layer filters were fabricated based on the DUV-3 design shown in FIG. 9. Hafnium oxide was chosen as the high index material based on low absorption and thermomechanical properties. Silicon dioxide was chosen as the low index material because of its low stress properties compared to other alternatives. Films were deposited using a Leybold APS 1104 ion assisted evaporation system. Hafnium oxide was reactively deposited from a hafnium metal target and silicon dioxide was deposited from an oxide target. The targeted bottom high index layer thickness was 32 nm, the thick low index cavity layer targeted thickness was 2548 nm, and the target high index top layer thickness was 41 nm. Iteration of the multilayer was carried out by performing metrology at various points during the stack fabrication. Initially, a two layer stack over the fused silica substrate was created without the final top $HfO_2$ layer. Ellipsometry and fitting solved for the actual $SiO_2$ thickness value, which was 7 nm short of the target value. A commercial optical thin film design software, TfCalc, was used together with WVASE to redesign the multilayer stack and arrive at a new solution. A second coating set was performed on the filter with a small additional amount of $SiO_2$ (7 nm) and the final $HfO_2$ top layer. Transmission results are shown in FIG. 18.

Figure 19:
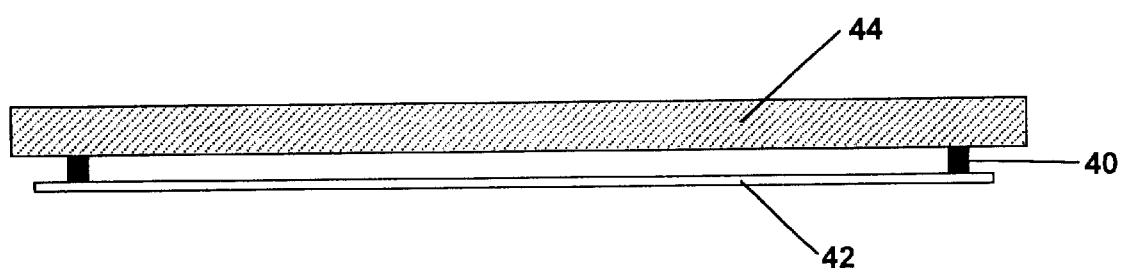
FIG. 19 illustrates a mounting method used for frequency filtering near the mask plane.

Lithographic testing was carried out on an 248 nm ASML 5500/300 exposure tool with a NA of 0.63. Partial coherence values chosen for testing were 0.3 and 0.5. Mask features evaluated consisted of 250 nm contacts on duty ratios of 1:1, 1:5 and isolated. A Shipley UV110 resist was coated at a thickness of 0.42 μm over a DUV ARC material for imaging. The quartz filter was mounted to an aluminum 3.28" diameter ring, 1 mm thick, and with a 3 mm height or standoff distance, as shown in FIG. 19. Mounting consisted of bonding the ring 40 to the filter 42 with a cyanoacrylate cement and mounting the ring 40 and filter 42 to the contact photomask 44 using removable adhesive. Although the filter was mounted at a fixed distance onto the mask, there are other means to place such a filter in the mask Fraunhofer diffraction region (at a distance of at least a few mm. For instance, an optical changing member (e.g. a turret with a plurality of filters) can be provided for selecting one of a number of a plurality of filters that provide preferred image modification for at least one optical characteristic of the photomask features and placing the selected filter at the required separation and location with respect to the mask and optical components. The ring method provided convenient means to mount the filter in an optical plane with control of parallelism between the mask and filter. For comparison during lithographic testing, an uncoated fused silica plate was also configured for mounting onto the photomask.

Figure 20:
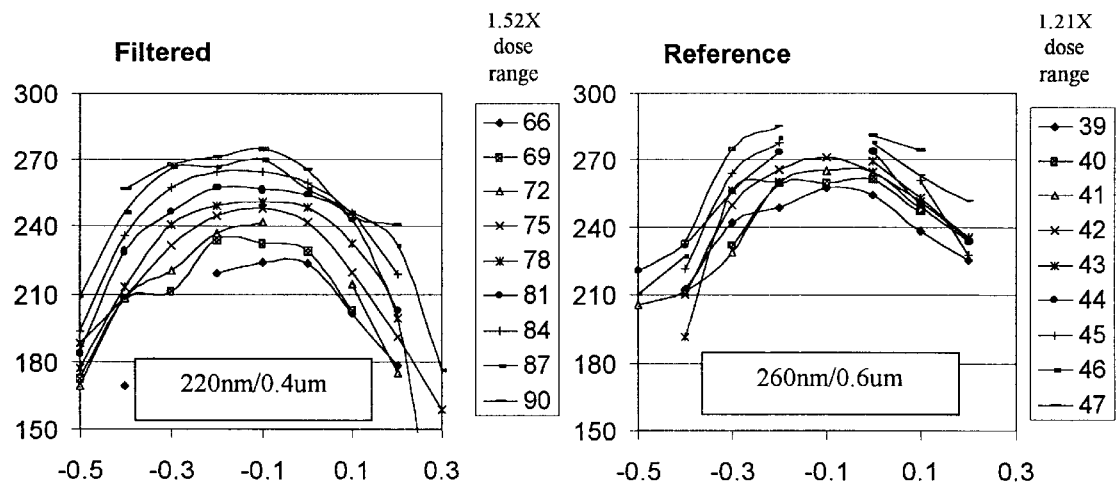
FIG. 20 are graphs comparing a is a comparison of dense contact F/E matrix (left) the filtered results and (right) the control (reference).
Figure 21:
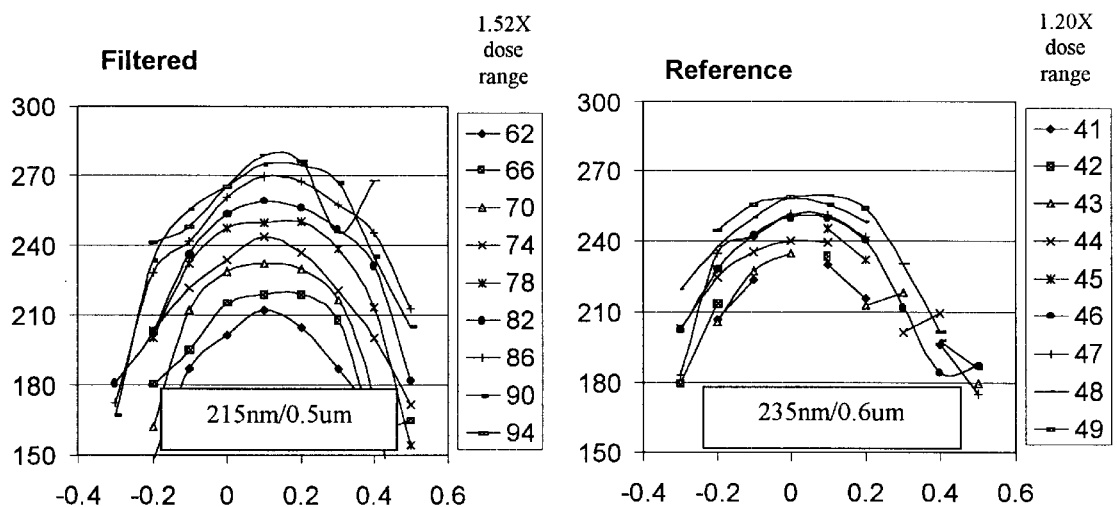
FIG. 21 is a comparison of semi-isolated contact F/E matrix (left) the filtered results and (right) the control (reference).
Figure 22:
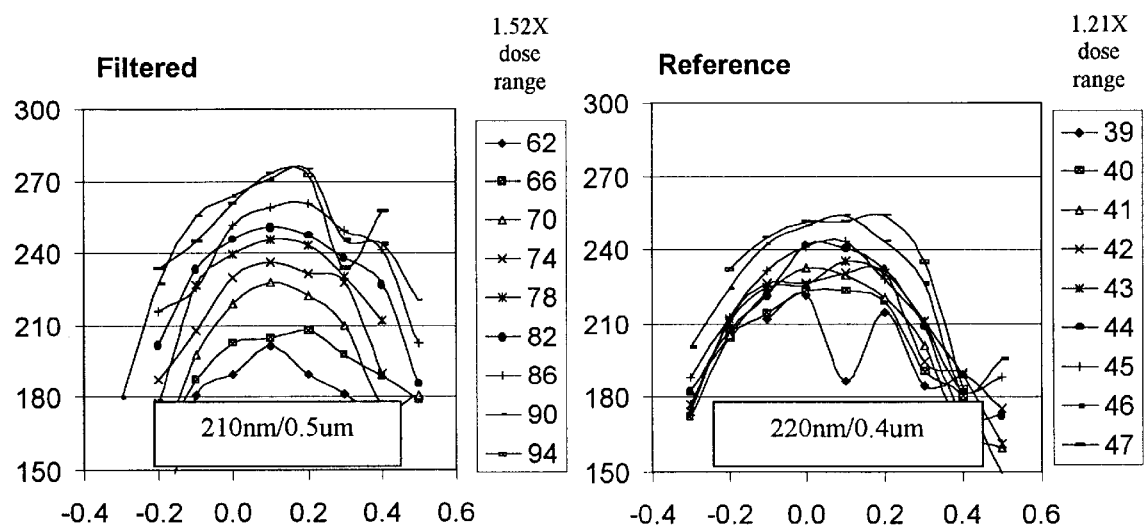
FIG. 22 is a comparison of'semi-isolated contact F/E matrix (left) the filtered results and (right) the control (reference).

Focus exposure plots are shown in FIGS. 20 through 22. FIG. 20 shows results for the filtered dense contact imaging (1:1) compared to the control "reference". The dose range for the filtered results is larger than that for the control (1.52X vs. 1.20X respectively). For each case, the minimum contact size and DOF is shown for a 10% dose variation and a 10% size variation. The contact sizing for the filtered case is measurably smaller than for the control, 220 nm vs. 260 nm. For semi-isolated contacts (1:5) shown in FIG. 21, the filtered contact results also exhibit smaller sizing. For isolated contacts shown in FIG. 22, were the most significant improvement is predicted, a smaller sizing results with an improvement in DOF over the control. There is also a significant improvement in process overlap between all duty ratios when the filtered result is compared to the control. This is summarized in Table 3 where the sizing range for the filtered contact is 210 to 220 nm and the sizing range for the control is 220 to 260 nm. This is a significant result.

TABLE 3

Comparison of results for spatial filtering vs. unfiltered (control) showing improvement in process overlap.

|  | Filtered | Control |
| --- | --- | --- |
| Dense sizing (1:1) | 220 nm | 260 nm |
| Semi-iso sizing (1:5) | 215 nm | 235 nm |

TABLE 3-continued

Comparison of results for spatial filtering vs. unfiltered (control) showing improvement in process overlap.

|  | Filtered | Control |
| --- | --- | --- |
| Iso sizing | 210 nm | 220 nm |
| Sizing range | 10 nm | 40 nm |

Second Embodiment

A second embodiment of the invention provides a projection exposure system as shown in FIG. 7 with an illumination system 2 that illuminates a photomask 8 so that diffraction field energy 11 is directed toward an objective lens 10. The projection exposure system is further provided with a filter 13 that lies outside of the objective lens 9 and at a predetermined minimum distance from the photoresist coated semiconductor substrate 10 at an analogous or complementary position to that for the mask plane. The filter 13 consists of a coating or coatings on a transparent substrate such that transmission is controlled though the filter based on angle of incidence where normal or near normal illumination is attenuated greater than more oblique illumination. By placing the filter at this location, the desired effect is also produced where. zero order diffraction energy is reduced. The design of the filter differs from the mask side filter in its angular requirement, where a ¼ or ⅕ reduction factor is not utilized. The benefits of this approach to the present invention can be that a transparent substrate may already be a component of the lens system, used to protect bottom elements from contamination and to isolate the lens system from atmosphere. By coating this transparent substrate to exhibit the properties of a spatial filter, image improvement can result.

Figure 23:
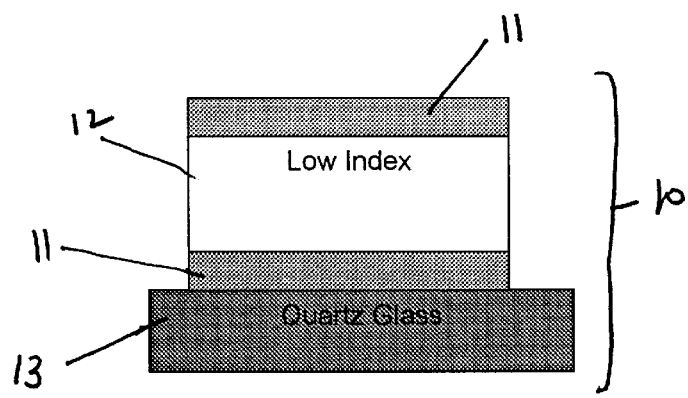
FIG. 23 illustrates an angular frequency filter design for use in the second embodiment of the invention.
Figure 24:
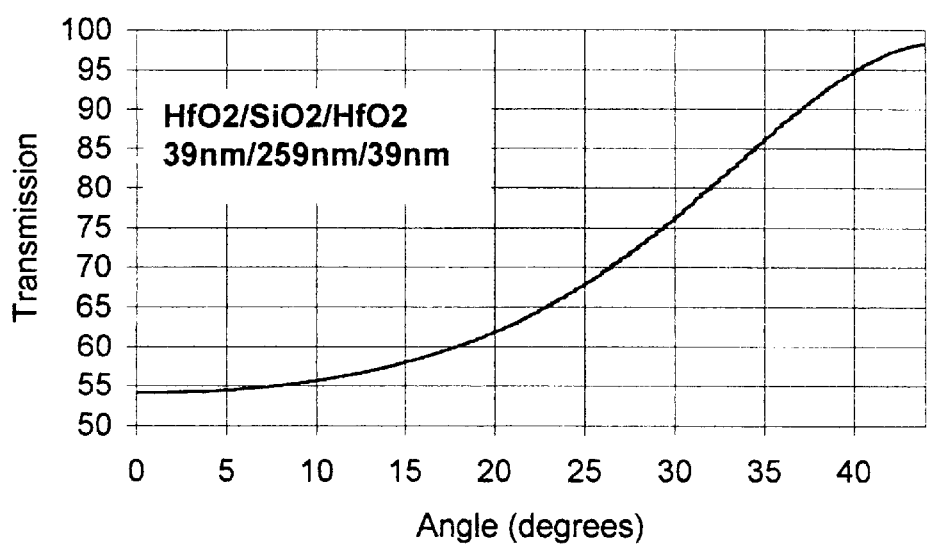
FIG. 24 is a graph that shows the transmission characteristics of a fused silica angular frequency filter design for us;e with the second embodiment of the invention.

FIG. 23 shows an angular filter design for use as a wafer side spatial frequency filter 13 of FIG. 7. The filter 10 consists of alternative layers of transparent high 11 and low 12 refractive index coating materials on a transparent substrate 13. FIG. 24 shows the transmission characteristics it a wavelength of a 248 nm fused silica filter designed and fabricated using Hafnium Dioxide and Silicon Dioxide. Thicknesses of the layers are given. Angles ranging from normal incidence (zero degrees) to 44 degrees are also shown, corresponding to a 0.70 NA objective lens. The larger angles of the high-NA side of the reduction objective lens allow for greater attenuation of near normal incidence radiation, therefore leading to greater attenuation of zero order diffraction energy as needed. Furthermore, attenuation matching to that of a frequency filter for use on the mask side of the objective lens can be obtained with lower layer thickness values and lower total thickness values of the filter coatings. This can lead to greater process control during filter fabrication.

Additionally, filters can be implemented at both the complimentary wafer and mask sides of the objective lens, that is at both location 12 and location 13 of FIG. 7, increasing the degree of control over spatial frequency filtering. This capability can prove useful as some minimum amount of filtering may be generally desired for most lithographic imaging and a semi-permanent filter (,an be positioned in one of the filtering planes. Filtering can be increased for certain desired imaging situations by incorporating a filter in the second complimentary filtering location. This is a also significant opportunity for imaging improvement.

Third Embodiment

Figure 25:
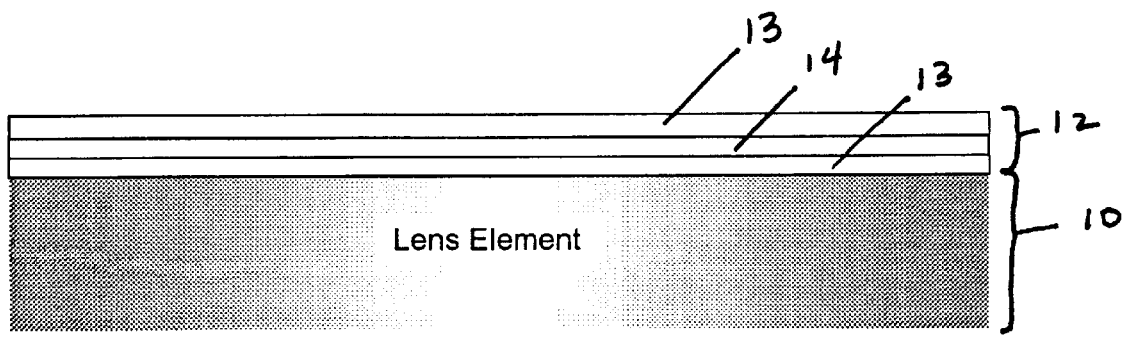
FIG. 25 shows a lens element coated with an angular frequency filter coating for use with the third embodiment of the invention.
Figure 26:
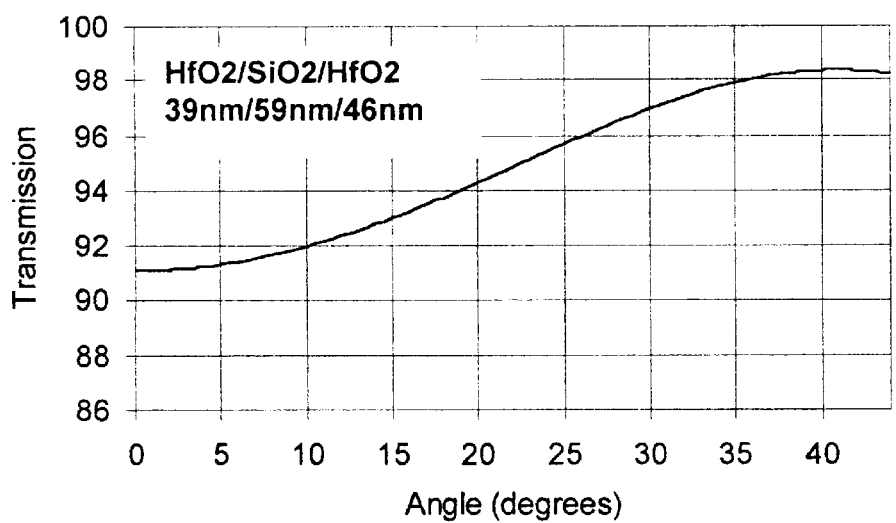
FIG. 26 is a graph that shows a transmission plot of a fused silica angular frequency filter coating for use with the third embodiment of the invention.

I have discovered that coating of the lens elements themselves, located as components of the objective lens, can lead to similar results as those described here. The thin film interference coatings can be designed and fabricated to be used on optical elements to filter diffraction energy at near normal incidence and emphasize energy at large angles. This is especially useful as high NA lenses are being made and traditional AR coatings are more difficult to design so that low reflectance is achieved at all angles. FIG. 25 shows this embodiment of the invention. An optical element 10 from an objective lens 11 is coated on one or either sides with an interference filter 12 that consists of one layer or a periodic structure of more than one layer, which in turn consists of alternating high refractive index films 13 and low refractive index films 14. FIG. 26 shows a plot of transmission verses angle for normal incidence to 44 degrees for a fused silica filter consisting of Hafnium Oxide and Silicon Dioxide coating. Film thicknesses are also shown. The degree of reflection reduction in a lens system, or anti-reflection (AR), is optimum at the most oblique angles, corresponding to the full NA of the system. Particular angular requirements of a lens element depend on particular lens element properties. Using this invention, coatings can be designed so that maximum reduction in reflection or AR is achieved at the most oblique angles with lower transmission and low angles. This relaxes design constraints and at the same time can lead to improved performance, as described previously. This is a significant result.

Spatial frequency filtering in an alternative Fourier Transform plane has been demonstrated with the present invention as a practical method of imaging enhancement. The designs and fabrication results are very encouraging for this new approach to resolution enhancement. Although the present invention has been described it is to be understood that it is not limited to these descriptive examples. The described embodiments are not necessarily exclusive and various changes and modifications in materials, designs, and placement may be made thereto without departing from the scope of the invention, which is only limited by the following claims.

What is claimed is:

1. A method for projecting an image onto a photosensitized semiconductor wafer comprising:

generating a beam of radiation for illuminating a photomask bearing a pattern;

directing the beam of radiation toward the photomask;

diffracting the beam of radiation with the photomask into a diffraction field with a plurality of angles of diffraction;

filtering the diffraction field from the photomask in accordance with an angle of diffraction of the diffraction field to obtain a filtered diffraction field;

directing the diffraction field into an objective lens;

illuminating the photosensitized semiconductor wafer with the filtered diffraction field;

wherein the diffraction field is filtered at a plane removed from a pupil plane of the objective lens and proximate one of the wafer and the photomask.

2. The method of claim 1, wherein filtering the diffraction field comprises attenuating the diffraction field inversely proportional to an order of diffraction.

3. The method of claim 1, wherein filtering the diffraction field comprises attenuating the diffraction field inversely proportional to the angle of diffraction.

4. The method of claim 1,
wherein filtering the diffraction field comprises filtering the diffraction field with a substrate and one or more thin films coated on the substrate,
wherein the substrate and said one or more thin films are highly transparent to a selected wavelength of radiation and are relatively different in their respective indexes of refraction to angularly filter incident radiation.

5. The method of claim 4,
wherein the substrate and the one or more thin films have extinction coefficients less than 0.5.

6. The method of claim 5,
wherein the extinction coefficient is less than 0.1.

7. The method of claim 4,
wherein a difference between the respective indexes of refraction is greater than 0.2 at the wavelength of illumination.

8. The method of claim 7,
wherein the respective indexes of refraction differ by 0.84 or 0.34.

9. The method of claim 4,
wherein the difference between the respective indexes of refraction of the one or more thin films is greater than 0.2 at the wavelength of illumination.

10. The method of claim 9,
wherein the respective indexes of refraction differ by 0.84 or 0.34.

11. The method of claim 4,
wherein a near normal radiation is reduced proportionately more than an oblique radiation.

12. The method of claim 11,
wherein a difference in filtering between the near normal and the near oblique radiation is in the range of 5% to 50%.

13. The method of claim 12,
wherein the difference in filtering between the near normal and the near oblique radiation is in the range of 16% to 30%.

14. The method of claim 4,
wherein the substrate and the one or more thin films comprise organic or inorganic materials.

15. The method of claim 14,
wherein the inorganic materials are selected from the group consisting of Al2O3, B2O3, BaF2, CrF3, GdF3, HfF4, LaF3, LiF, MgF2, NdF3, P2O5, SrF2, YbF3, YF3, HfO2 and SiO2.

16. The method of claim 14, wherein the organic materials comprise polymers.

17. The method of claim 16,
wherein the polymers are selected from the group consisting of fluoropolymer and nitrocellulose polymers.

18. An apparatus for projecting an image onto a photosensitized semiconductor wafer comprising:
a radiation source arranged to generate a beam of radiation to illuminate a photomask bearing a pattern;
an illumination optical system configured and arranged to distribute the beam of radiation in a desired pattern of illumination;
an optical system configured and arranged to direct the illumination pattern of radiation onto a photomask;
a photomask bearing a pattern disposed in a path of the directed illumination to diffract an incident radiation into a diffraction field with a plurality of angles of diffraction;
an objective lens system configured and arranged to focus and project the diffraction field onto a plane corresponding to the location of a surface of a photosensitized semiconductor wafer; and
an angular filter disposed at a plane removed from a pupil plane of the objective lens and proximate one of the photosensitized semiconductor wafer and the photomask to vary the intensity of the projected diffraction field in accordance with angles of diffraction of radiation passing through the angular filter.

19. The apparatus of claim 18,
wherein the photomask diffracts a radiation into one or more orders of diffraction and the angular filter reduces the transmission of the radiation in inverse proportion to an order of diffraction of the radiation.

20. The apparatus of claim 17,
wherein the angular filter reduces the transmission of a diffracted radiation inversely proportional to the angle of diffraction of the radiation.

21. The apparatus of claim 20,
wherein a zeroth order of diffraction has a most percentage reduction of transmission and each successive higher order of diffraction has a corresponding higher percentage of transmission.

22. The apparatus of claim 18 further comprising: at least one angular filter disposed
(a) between the photomask and the objective lens, and/or
(b) in or on the objective lens.

23. The apparatus of claim 18,
wherein the angular filter comprises a substrate and one or more thin films coated on the substrate,
wherein the substrate and the one or more thin films are highly transparent to a selected wavelength of radiation and are relatively different in their respective indexes of refraction to angularly filter the radiation.

24. The apparatus of claim 21
wherein the photosensitized semiconductor wafer and the one or more thin films have extinction coefficients less than 0.5.

25. The apparatus of claim 23,
wherein the extinction coefficients are less than 0.1.

26. The apparatus of claim 23,
wherein a difference between the respective indexes of refraction is greater than 0.2 at the wavelength of illumination.

27. The apparatus of claim 26,
wherein the indexes differ by 0.84 or 0.34.

28. The apparatus of claim 23,
wherein a difference between the respective indexes of refraction of the one or more thin films is greater than 0.2 at the wavelength of illumination.

29. The apparatus of claim 28,
wherein the indexes differ by 0.84 or 0.34.

30. The apparatus of claim 23,
wherein a near normal radiation is reduced proportionately more than an oblique radiation.

31. The apparatus of claim 30,
wherein a difference in filtering between the normal and the oblique radiation is in the range of 5% to 50%.

32. The apparatus of claim 31,
wherein the difference in filtering between the normal and the oblique radiation is in the range of 16% to 30%.

33. The apparatus of claim 23,
wherein the substrate and the one or more thin films comprise organic or inorganic materials.

34. The apparatus of claim 32, wherein the inorganic materials are selected from the group consisting of Al2O3, B2O3, BaF2, CrF3, GdF3, HfF4, LaF3, LiF, MgF2, NdF3, P2O5, SrF2, YbF3, YF3 HfO2 and SiO2.

35. The apparatus of claim 23, wherein the organic materials comprise polymers.

36. The apparatus of claim 35, wherein the polymers are selected from the group consisting of a fluoropolymer and nitrocellulose polymers.

37. The method of claim 1, wherein illuminating the photosensitized semiconductor wafer comprises illuminating the photosensitized semiconductor wafer with strong off-axis illumination.

38. The method of claim 1, wherein illuminating the photosensitized semiconductor wafer comprises illuminating the photosensitized semiconductor wafer with weak off-axis illumination.

39. The apparatus of claim 18, wherein the illumination optical system comprises a strong off-axis illumination optical system.

40. The apparatus of claim 18, wherein the illumination optical system comprises a weak off-axis illumination optical system.

41. The method of claim 1, further comprising:

mounting a filter on a ring disposed between the filter and the photomask.

42. The apparatus of claim 18, further comprising:

a ring mounted on the photomask and the angular filter is mounted on the ring spaced apart from the photomask.

43. The apparatus of claim 18, further comprising:

a filter housing holding a plurality of filters moveable into the diffraction field.

44. The method of claim 4, wherein a ratio of an intensity of radiation at a near normal to an intensity of radiation at a near oblique is in the range of 0.5 to 0.95.

45. The apparatus of claim 23, wherein a ratio of an intensity of radiation at a near normal radiation to an intensity of radiation at a near oblique is in the range of 0.5 to 0.95.

46. The method of claim 1, wherein the filtering further comprises attenuating the diffraction field such that an intensity proximate an optical axis of the diffraction field is reduced more than an intensity removed from the optical axis.

47. The apparatus of claim 18, wherein the angular filter is constructed and arranged to attenuate the diffraction field such that an intensity proximate an optical axis of the diffraction field is reduced more than an intensity removed from the optical axis.

* * * * *